United States Patent
Xiao (10) Patent No.: US 11,309,341 B2
(45) Date of Patent: Apr. 19, 2022

(54) DISPLAY PANEL AND METHOD OF FABRICATING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Hui Xiao, Shenzhen (CN)

( * ) Notice: Subject to any disclaimer, the term of this patent is extended or adjusted under 35 U.S.C. 154(b) by 260 days.

(21) Appl. No.: 16/625,722

(22) PCT Filed: Nov. 6, 2019

(86) PCT No.: PCT/CN2019/116107
§ 371 (c)(1),
(2) Date: Dec. 22, 2019

(87) PCT Pub. No.: WO2021/042500
PCT Pub. Date: Mar. 11, 2021

(65) Prior Publication Data
US 2022/0005842 A1   Jan. 6, 2022

(30) Foreign Application Priority Data
Sep. 5, 2019 (CN) .......................... 201910836523.2

(51) Int. Cl.
*H01L 27/12* (2006.01)
*H01L 21/385* (2006.01)
*H01L 27/15* (2006.01)
*H01L 27/32* (2006.01)

(52) U.S. Cl.
CPC ...... *H01L 27/1248* (2013.01); *H01L 27/1255* (2013.01); *H01L 27/1259* (2013.01); *H01L 21/385* (2013.01); *H01L 27/1225* (2013.01); *H01L 27/156* (2013.01); *H01L 27/3258* (2013.01); *H01L 2227/323* (2013.01)

(58) Field of Classification Search
CPC ............. H01L 27/1225; H01L 27/1255; H01L 27/3258; H01L 27/3272; H01L 29/7869; H01L 29/78693
See application file for complete search history.

(56) References Cited

U.S. PATENT DOCUMENTS

| | | |
|---|---|---|
| 6,316,294 B1 | 11/2001 | Yoon et al. |
| 2004/0144982 A1 | 7/2004 | Yamazaki et al. |
| 2005/0077523 A1* | 4/2005 | Ahn ...................... H01L 27/124 257/72 |
| 2007/0007524 A1 | 1/2007 | You et al. |

(Continued)

FOREIGN PATENT DOCUMENTS

| | | |
|---|---|---|
| CN | 1893116 A | 1/2007 |
| CN | 103199113 A | 7/2013 |

(Continued)

*Primary Examiner* — Bryan R Junge (57) ABSTRACT

A display panel and a method of fabricating the same are provided. The display panel has a substrate, an active layer disposed on the substrate, a gate insulating layer and a gate metal layer stacking-disposed on the active layer, wherein the active layer has an active island, the active island has a conductor layer and a semiconductor layer aligned with and in contact with the gate insulating layer, and the conductor layer is provided with a protective layer.

14 Claims, 7 Drawing Sheets

(56) References Cited

U.S. PATENT DOCUMENTS

| | | | |
|---|---|---|---|
| 2012/0052625 A1* | 3/2012 | Yamazaki | H01L 27/1214 438/104 |
| 2012/0091460 A1* | 4/2012 | Park | H01L 27/1248 257/59 |
| 2013/0313529 A1* | 11/2013 | Kim | H01L 27/1255 257/40 |
| 2014/0361289 A1* | 12/2014 | Suzawa | H01L 29/66969 257/43 |
| 2015/0179724 A1* | 6/2015 | Lee | H01L 27/3244 257/40 |
| 2015/0255618 A1 | 9/2015 | Chen et al. | |
| 2015/0303222 A1 | 10/2015 | Ning | |
| 2016/0133681 A1* | 5/2016 | Nam | H01L 27/3265 257/40 |
| 2018/0248032 A1 | 8/2018 | Zhou | |

FOREIGN PATENT DOCUMENTS

| | | |
|---|---|---|
| CN | 103646966 A | 3/2014 |
| CN | 105514116 A | 4/2016 |
| JP | 2002050633 A | 2/2002 |

\* cited by examiner

DISPLAY PANEL AND METHOD OF FABRICATING SAME

FIELD OF DISCLOSURE

The present disclosure relates to displays, and more particularly to a display panel and a method of fabricating the same.

BACKGROUND OF DISCLOSURE

In display panel industries, in a current oxide TFT (oxide thin film transistor), a portion of a semiconductor layer made of IGZO (indium gallium zinc oxide) is conductorized, and when a subsequent thermal process time increases, the conductorized portion of the semiconductor layer has a problem of an increase in impedance.

SUMMARY OF DISCLOSURE

In a process in which a portion of a semiconductor layer made of IGZO is conductorized, when a subsequent thermal process time is increased, the conductorized portion of the semiconductor layer has a technical problem of an increase in impedance.

A display panel comprises:
a substrate;
a light shielding layer disposed on the substrate;
a buffer layer disposed on the substrate and covering the light shielding layer;
an active layer disposed on the buffer layer;
a gate insulating layer and a gate metal layer stacking-disposed on the active layer;
an interlayer dielectric layer disposed on the buffer layer and covering the gate metal layer;
a second metal layer disposed on the interlayer dielectric layer, wherein
the second metal layer comprises a source/drain metal layer;
a passivation layer and a flat layer stacking-disposed on the interlayer dielectric layer;
an anode metal layer, a light emitting layer, and a cathode metal layer stacking-disposed on the flat layer;
wherein the flat layer is further provided with a pixel defining layer, the pixel defining layer is provided with a pixel opening, and the light emitting layer is located in the pixel opening; and wherein the active layer comprises an active island comprising a conductor layer and a semiconductor layer aligned with and in contact with the gate insulating layer, the conductor layer is provided with a protective layer, and the source/drain metal layer passes through the protective layer to contact and connect with the conductor layer.

Further, the gate metal layer is provided with a protective layer covering the gate metal layer.

Further, the light shielding layer comprises a first metal electrode plate, the active layer further comprises a dielectric layer independent of the active island, the dielectric layer has a position aligned with the first metal electrode plate, and the second metal layer further comprises a second metal electrode plate disposed on the dielectric layer and independent of the source/drain metal layer.

Further, the dielectric layer is further provided with a protective layer covering the dielectric layer.

Further, the interlayer dielectric layer is defined with an opening, wherein the second metal electrode plate is located in the opening.

Further, the protective layer is an aluminum oxide protective layer.

A display panel, comprises:
a substrate;
a light shielding layer disposed on the substrate;
a buffer layer disposed on the substrate and covering the light shielding layer;
an active layer disposed on the buffer layer;
a gate insulating layer and a gate metal layer stacking-disposed on the active layer;
an interlayer dielectric layer disposed on the buffer layer and covering the gate metal layer;
a second metal layer disposed on the interlayer dielectric layer, wherein the second metal layer comprises a source/drain metal layer;
a passivation layer and a flat layer stacking-disposed on the interlayer dielectric layer;
an anode metal layer, a light emitting layer, and a cathode metal layer stacking-disposed on the flat layer;
wherein the active layer comprises an active island comprising a conductor layer and a semiconductor layer aligned with and in contact with the gate insulating layer, the conductor layer is provided with a protective layer, and the source/drain metal layer passes through the protective layer to contact and connect with the conductor layer.

Further, the gate metal layer is provided with a protective layer covering the gate metal layer.

Further, the light shielding layer comprises a first metal electrode plate, the active layer further comprises a dielectric layer independent of the active island, the dielectric layer has a position aligned with the first metal electrode plate, and the second metal layer further comprises a second metal electrode plate disposed on the dielectric layer and independent of the source/drain metal layer.

Further, the dielectric layer is further provided with a protective layer covering the dielectric layer.

Further, the interlayer dielectric layer is defined with an opening, wherein the second metal electrode plate is located in the opening.

Further, the protective layer is an aluminum oxide protective layer.

The disclosure also provides a method of fabricating a display panel, comprising the following steps:
a step S10 of forming a light shielding layer on a substrate and a buffer layer covering the light shielding layer, wherein the light shielding layer comprises a first metal electrode plate;
a step S20 of forming a patterned active layer on the buffer layer, wherein the active layer comprises an active island and a dielectric layer independent of the active island, and a position of the dielectric layer is aligned with a position of the first metal electrode plate;
a step S30 of sequentially forming a gate insulating layer and a gate metal layer in stack on the active island;
a step S40 of conductorizing a portion of the active island exposing over the gate insulating layer to form a conductor layer, and forming a protective layer covering the conductor layer;
a step S50 of forming an interlayer dielectric layer covering the active layer and the gate metal layer;
a step S60 of forming a second metal layer on the interlayer dielectric layer and the dielectric layer, and patterning the second metal layer to form a source/drain metal layer in contact with and in connection with the conductor layer and a second metal electrode plate independent of the source/drain metal layer, wherein the second metal electrode plate is disposed on the dielectric layer to form a storage capacitor with the first metal electrode plate;

a step S70 of forming a passivation layer and a flat layer in stack on the interlayer dielectric layer; and a step S80 of sequentially forming an anode metal layer, a light emitting layer, and a cathode metal layer in stack on the flat layer.

Further, the step S40 comprises:

a step S41 of forming a thin film from aluminum or/and aluminum oxide on the portion of the active island exposing over the gate insulating layer; and a step of S42, thermally annealing the thin film in an environment with oxygen, diffusing aluminum molecules into the portion of the active island exposing over the gate insulating layer, such that the portion of the active island exposing over the gate insulating layer forms the conductor layer, while oxygen atoms in the active island diffuse into the thin film to form the protective layer on the conductor layer, wherein the protective layer is an aluminum oxide protective layer.

Further, a protective layer is also formed on the gate metal layer and the dielectric layer while forming the protective layer on the conductor layer.

Further, the step S60 comprises:

a step S61 of forming an opening in a position of the interlayer dielectric layer aligned with the first metal electrode plate to expose the dielectric layer;

a step S62 of forming a second metal layer on the interlayer dielectric layer and the dielectric layer; and a step S63 of performing a patterning treatment on the second metal layer to form a source/drain metal layer in contact with and in connection with the conductor layer and a second metal electrode plate independent of the source/drain metal layer, wherein the second metal electrode plate is disposed on the dielectric layer to form the storage capacitor with the first metal electrode plate.

By utilizing mutual diffusion of aluminum atoms and oxygen atoms in an indium gallium zinc oxide, the indium gallium zinc oxide is changed from a semiconductor to a conductor to form a conductor layer. At the same time, a structurally dense aluminum oxide protective layer is formed on a surface of the conductor layer to protect the conductor layer after being conductorized, so as to avoid the conductor layer from being affected by subsequent processes. Simultaneously, the aluminum oxide has a characteristic of high resistance value, which can effectively improve capacitance per unit area of the storage capacitor and meet requirements of high resolution.

DESCRIPTION OF DRAWINGS

In order to more clearly describe technical solutions in embodiments or in conventional technologies, drawings required to be used for the embodiments in conventional technologies are simply described hereinafter. Apparently, the drawings described below only illustrate some embodiments of the present disclosure. Those skilled in the art can obtain other drawings based on these drawings disclosed herein without creative effort.

REFERENCE NUMERALS

10: substrate; 21: first metal electrode plate; 30: buffer layer; 40: active layer; 41: active island; 411: conductor layer; 42: dielectric layer; 50: gate insulating layer; 60: gate metal layer; 70: interlayer dielectric layer; 71: opening; 81: source/drain metal layer; 82: second metal electrode plate; 101: passivation layer; 102: flat layer; 103: anode metal layer; 104: light emitting layer; 105: cathode metal layer; 106: pixel defining layer; 107: protective layer.

DETAILED DESCRIPTION OF PREFERRED EMBODIMENTS

The following description of the embodiments is intended to be illustrative of the specific embodiments. Directional terms mentioned in the present disclosure, such as "upper", "lower", "front", "back", "left", "right", "top", "bottom", etc., are only directions by referring to the accompanying drawings. Thus, the used directional terms are used to describe and understand the present disclosure rather than limiting the present disclosure. In the figures, structurally similar elements are denoted by the same reference numerals.

The present disclosure is directed to the conventional display panel, in which a conductorized portion in the semiconductor layer has a technical problem of increased impedance when a subsequent thermal process time is increased. The present disclosure can solve the above problems.

Figure 1:
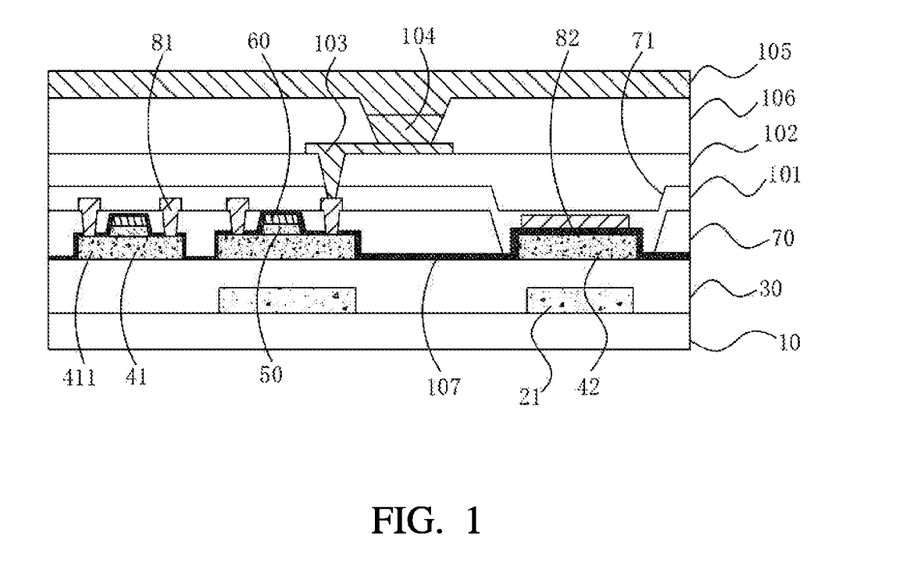
FIG. 1 is a schematic structural view of a display panel according to a detailed implementation of the present disclosure.

As shown in FIG. 1, a display panel comprises: a substrate 10; a light shielding layer disposed on the substrate 10; a buffer layer 30 disposed on the substrate 10 and covering the light shielding layer; an active layer 40 disposed on the buffer layer 30; a gate insulating layer 50 and a gate metal layer 60 stacking-disposed on the active layer 40; an interlayer dielectric layer 70 disposed on the buffer layer 30 and covering the gate metal layer 60; a second metal layer disposed on the interlayer dielectric layer 70; a passivation layer 101 and a flat layer 102 stacking-disposed on the interlayer dielectric layer 70; and an anode metal layer 103, a light emitting layer 104, and a cathode metal layer 105 stacking-disposed on the flat layer 102.

Wherein, the flat layer is further provided with a pixel defining layer 106, the pixel defining layer 106 is provided with a pixel opening, and the light emitting layer 104 is located in the pixel opening.

Wherein the active layer 40 comprises an active island 41 comprising a conductor layer 411 and a semiconductor layer 411 aligned with and in contact with the gate insulating layer 50. A surface of the conductor layer 411 is provided with a protective layer 107 covering the conductor layer 411. The second metal layer includes a source/drain metal layer 81, and the source/drain metal layer 81 passes through the protective layer 107 to contact and connect with the conductor layer 411.

The conductor layer 411 is covered by the protective layer 107 to induce an effect of heat insulation, so as to prevent subsequent thermal processes from increasing impedance of the conductor layer 411, and to avoid the conductor layer 411 from being affected by subsequent thermal processes. A thermal stability of the conductor layer 411 is improved.

Specifically, the light shielding layer comprises a first metal electrode plate 21, the active layer 40 further comprises a dielectric layer 42 independent of the active island 41, the dielectric layer 42 has a position aligned with the first metal electrode plate 21, and the second metal layer further comprises a second metal electrode plate 82 disposed on the dielectric layer 42 and independent of the source/drain metal layer 81.

The first metal electrode plate 21 and the second metal electrode plate 82 form a storage capacitor, and a portion of the active layer 40 serves as a dielectric material of the storage capacitor.

Further, a surface of the gate metal layer 60 and a surface of the dielectric layer 42 are both covered with a protective layer 107.

The gate metal layer 60 is protected by the protective layer 107, and the protective layer 107 and the active layer 40 simultaneously serve as a dielectric material of the storage capacitor, thereby effectively improving a capacitance per unit area of the storage capacitor, so as to satisfy requirements of high resolution.

Specifically, the active layer 40 is made of indium gallium zinc oxide, and the protective layer 107 is an aluminum oxide protective layer 107.

The conductive layer 411 after being conductorized can be protected by the structurally dense aluminum oxide protective layer 107, so as to avoid the conductor layer 411 from being affected by subsequent processes, and the stability of the conductor layer 411 is improved, and the aluminum oxide has high resistance characteristics. It can effectively increase the capacitance per unit area of the storage capacitor to meet the high resolution requirements.

The conductive layer 411 after being conductorized can be protected by the structurally dense aluminum oxide protective layer 107, so as to avoid the conductor layer 411 from being affected by subsequent processes. The stability of the conductor layer 411 is improved. Simultaneously, the aluminum oxide has a characteristic of high resistance value, which can effectively improve capacitance per unit area of the storage capacitor and meet requirements of high resolution.

Specifically, the interlayer dielectric layer 70 is provided with an opening 71, and the second metal electrode plate 82 is located in the opening 71.

Figure 2:
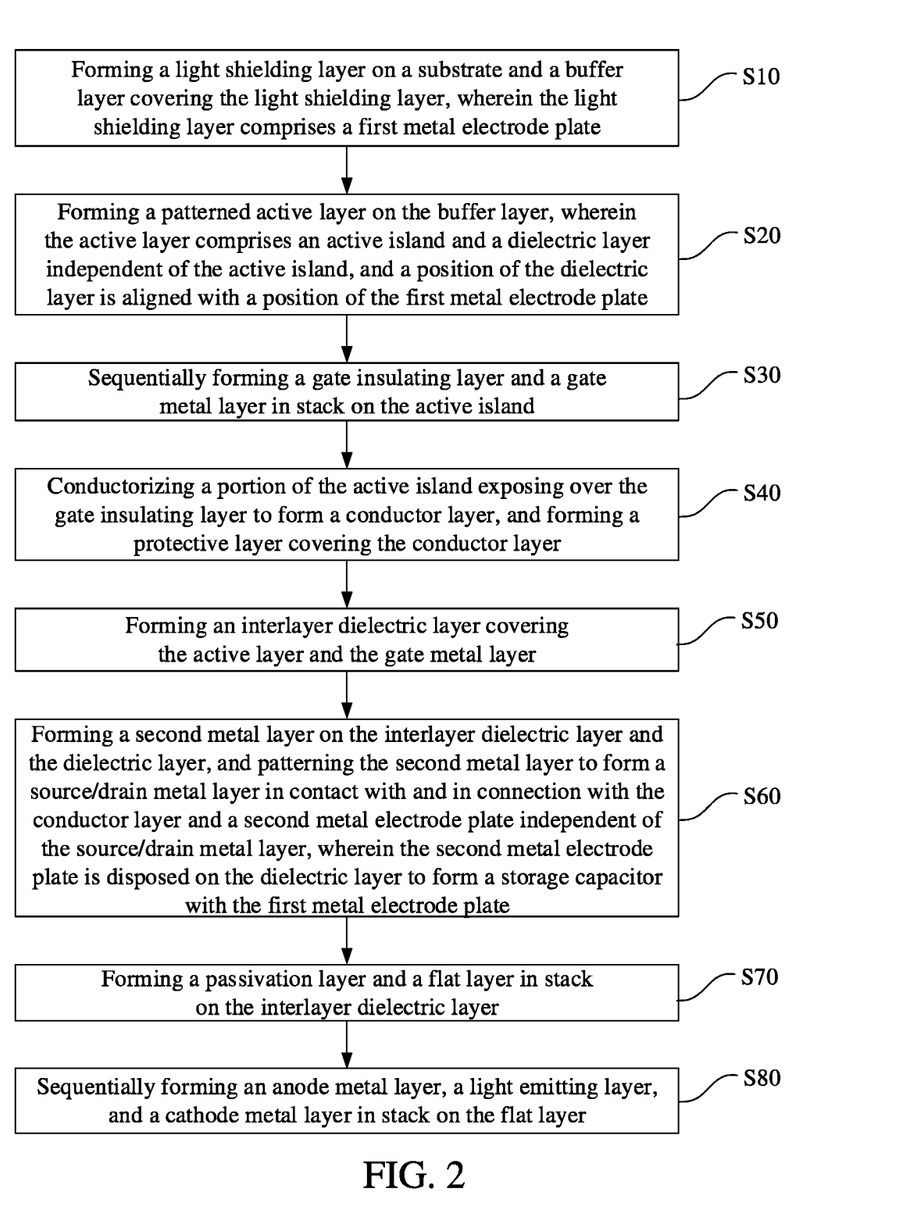
FIG. 2 is a schematic view showing steps of fabricating a display panel according to a detailed implementation of the present disclosure.

According to the above display panel, the present disclosure further provides a method of fabricating a display pane comprising following steps, as shown in FIG. 2:

In step S10, a light shielding layer is formed on a substrate 10 and a buffer layer 30 covering the light shielding layer is formed, wherein the light shielding layer comprises a first metal electrode plate 21.

In step S20, a patterned active layer 40 is formed on the buffer layer 30, wherein the active layer 40 comprises an active island 41 and a dielectric layer 42 independent of the active island 41, and a position of the dielectric layer 42 is aligned with a position of the first metal electrode plate 21.

In step S30, a gate insulating layer 50 and a gate metal layer 60 are sequentially formed in stack on the active island 41.

In step S40, a portion of the active island 41 exposing over the gate insulating layer 50 is conductorized to form a conductor layer 411, and a protective layer 107 covering the conductor layer 411 is formed.

In step S50, an interlayer dielectric layer 70 covering the active layer 40 and the gate metal layer 60 is formed.

In step S60, a second metal layer is formed on the interlayer dielectric layer 70 and the dielectric layer 42, and the second metal layer is patterned to form a source/drain metal layer 81 in contact with and in connection with the conductor layer 411 and a second metal electrode plate 82 independent of the source/drain metal layer 81, wherein the second metal electrode plate 82 is disposed on the dielectric layer 42 to form a storage capacitor with the first metal electrode plate 21.

In step S70, a passivation layer 101 and a flat layer 102 are formed in stack on the interlayer dielectric layer 70.

In step S80, an anode metal layer 103, a light emitting layer 104, and a cathode metal layer 105 are sequentially formed in stack on the flat layer 102.

Specifically, the step S40 comprises:
- a step S41 of forming a thin film from aluminum and/or aluminum oxide on the portion of the active island exposing over the gate insulating layer 50; and
- a step of S42, thermally annealing the thin film in an environment with oxygen, diffusing aluminum molecules into the portion of the active island 41 exposing over the gate insulating layer 50, such that the portion of the active island 41 exposing over the gate insulating layer 50 forms the conductor layer 411, while oxygen atoms in the active island 41 diffuse into the thin film to form the protective layer 107 on the conductor layer 411, wherein the protective layer 107 is an aluminum oxide protective layer 107.

The active layer 40 is made of indium gallium zinc oxide. By utilizing mutual diffusion of aluminum atoms and oxygen atoms in an indium gallium zinc oxide, the indium gallium zinc oxide is changed from a semiconductor to a conductor to form a conductor layer 411. At the same time, a structurally dense aluminum oxide protective layer 107 is formed on a surface of the conductor layer 411, which can protect the conductor layer 411 after being conductorized, so as to avoid the conductor layer 411 from being affected by subsequent processes.

Further, a protective layer 107 is also formed on the gate metal layer 60 and the dielectric layer 42 while forming the protective layer 107 on the conductor layer 411.

Specifically, the step S60 comprises:
- a step S61 of forming an opening 71 in a position of the interlayer dielectric layer 70 aligned with the first metal electrode plate 21 to expose the dielectric layer 42;
- a step S62 of forming a second metal layer on the interlayer dielectric layer 70 and the dielectric layer 42; and
- a step S63 of performing a patterning treatment on the second metal layer to form a source/drain metal layer 81 in contact with and in connection with the conductor layer 411 and a second metal electrode plate 82 independent of the source/drain metal layer 81, wherein the second metal electrode plate 82 is disposed on the dielectric layer 42 to form the storage capacitor with the first metal electrode plate 21.

The aluminum oxide has a characteristic of high resistance value, which can effectively improve capacitance per unit area of the storage capacitor and meet requirements of high resolution.

Referring to FIG. 3 to FIG. 7, FIG. 3 to FIG. 7 are schematic diagrams showing a preparation process of a display panel.

Figure 3:
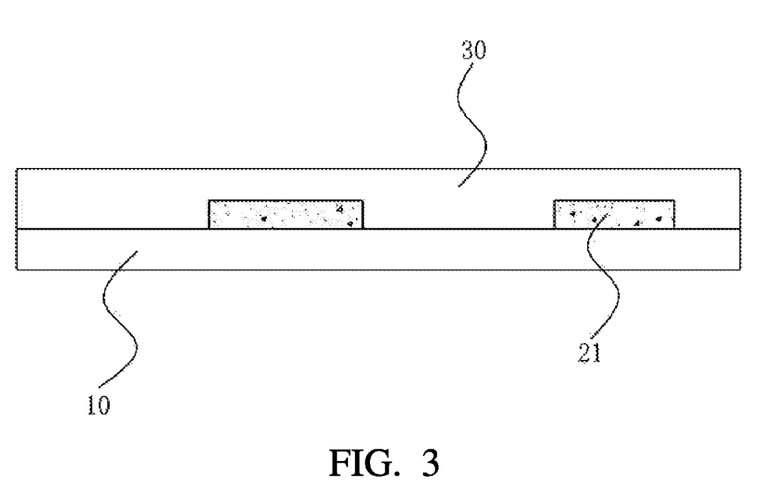
FIG. 3 to FIG. 7 are schematic diagrams showing a preparation process of a display panel according to a detailed implementation of the present disclosure.

As shown in FIG. 3, after a light shielding layer is formed on the substrate 10, the light shielding layer is patterned to form a first metal electrode plate 21, and then the buffer layer 30 covering the light shielding layer is formed.

Figure 4:
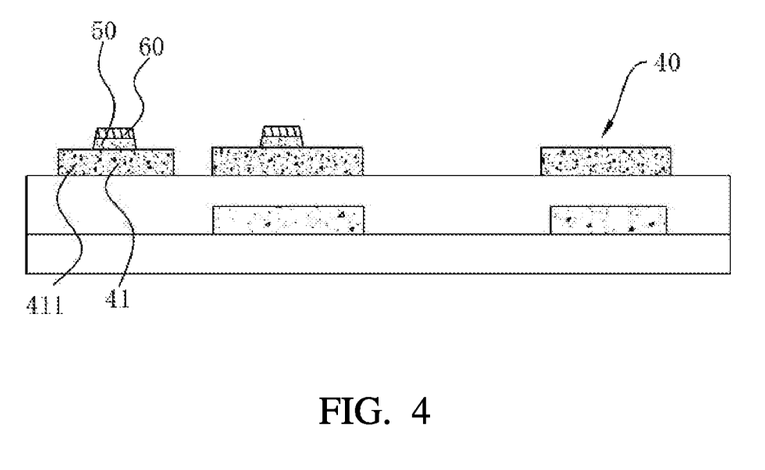

As shown in FIG. 4, an active layer 40 is formed on the buffer layer 30, and the active layer 40 is patterned to form an active island 41, and a dielectric layer 42 independent of the active island 41, and a position of the dielectric layer 42 is aligned with a position of the first metal electrode plate 21. Then, a gate insulating layer 50 and a gate metal layer 60 are sequentially formed in stack on the active island 41.

Figure 5:
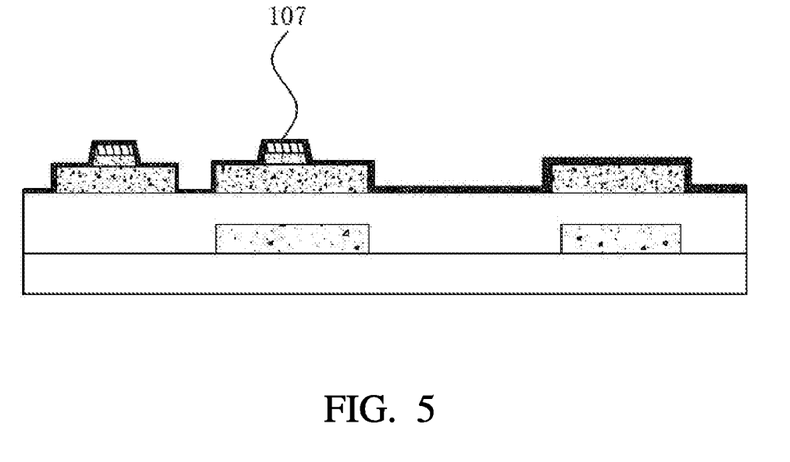

As shown in FIG. 5, a thin film covering the active layer 40 and the gate metal layer 60 is formed by sputtering using an aluminum and/or an aluminum oxide target, or using an ALD machine, and is thermally annealed in an environment with oxygen, so as to diffuse the aluminum atoms into the active layer 40 to form the conductor layer 411, while the oxygen atoms in the active layer 40 diffuse into the thin film to form the aluminum oxide protective layer 107.

Figure 6:
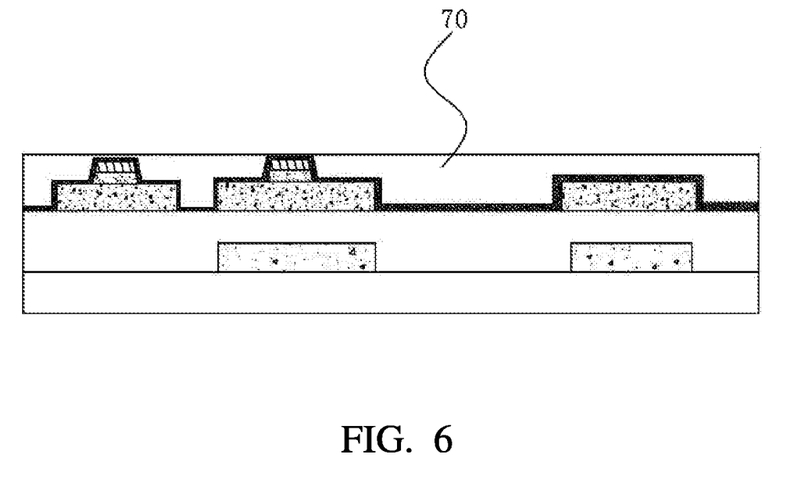

As shown in FIG. 6, an interlayer dielectric layer 70 covering the active layer 40 and the gate metal layer 60 is formed using a silicon oxide material.

Figure 7:
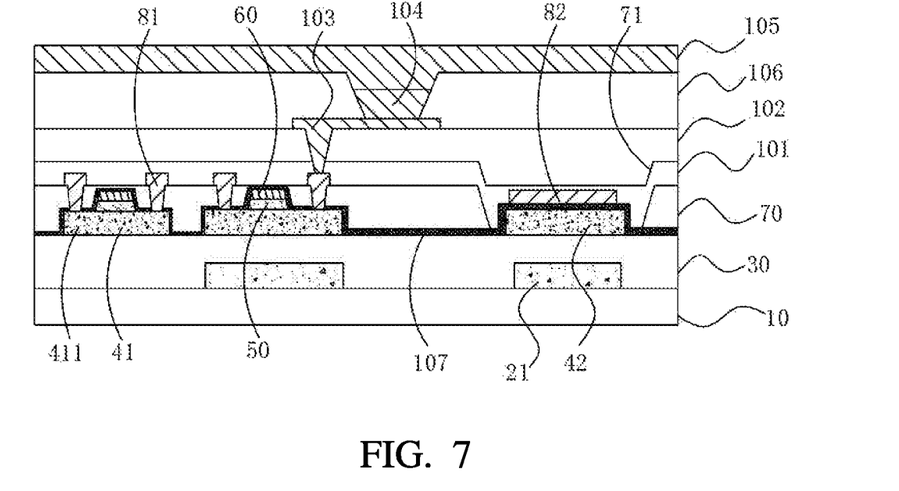

As shown in FIG. 7, a hole for connecting the source/drain metal layer 81 and the conductor layer 411 is formed in the interlayer dielectric layer 70, and the protective layer 107 at a position aligned with the hole is removed to facilitate connecting the source/drain metal layer 81 with the conductor layer 411. At the same time, an opening 71 is formed in the interlayer dielectric layer 70 to expose the dielectric layer 42.

Subsequently, a second metal layer filling the hole and the opening 71 is formed on the interlayer dielectric layer 70, and the second metal layer is patterned to form a source/drain metal layer 81 in contact with and in connection with the conductor layer 411 and a second metal electrode plate 82 independent of the source/drain metal layer 81.

Subsequently, a passivation layer 101 covering the second metal layer is formed on the interlayer dielectric layer 70, and a flat layer 102 is formed on the passivation layer 101.

Subsequently, after the pixel defining layer 106 and the anode metal layer 103 in contact with and in connection with a drain in the source/drain metal layer 81 are formed on the flat layer 102, a light emitting layer 104 and a cathode metal layer 105 are formed on the anode metal layer 103.

Beneficial effects of the present disclosure are that: by utilizing mutual diffusion of aluminum atoms and oxygen atoms in an indium gallium zinc oxide, the indium gallium zinc oxide is changed from a semiconductor to a conductor to form a conductor layer 411. At the same time, a structurally dense aluminum oxide protective layer 107 is formed on a surface of the conductor layer 411 to protect the conductor layer 411 after being conductorized, so as to avoid the conductor layer 411 from being affected by subsequent processes. Simultaneously, the aluminum oxide has a characteristic of high resistance value, which can effectively improve capacitance per unit area of the storage capacitor and meet requirements of high resolution.

As described above, although the present disclosure has been disclosed in the preferred embodiments as above, the above preferred embodiments are not intended to limit the present disclosure. Those skilled in the art can make various changes and modifications without departing from the spirit and scope of the present disclosure. Therefore, the protection scope of the present disclosure is defined by the scope of the claims.

The invention claimed is:
1. A display panel, comprising:
a substrate;
a light shielding layer disposed on the substrate;
a buffer layer disposed on the substrate and covering the light shielding layer;
an active layer disposed on the buffer layer;
a gate insulating layer and a gate metal layer stacking-disposed on the active layer;
an interlayer dielectric layer disposed on the buffer layer and covering the gate metal layer;
a second metal layer disposed on the interlayer dielectric layer, wherein the second metal layer comprises a source/drain metal layer;
a passivation layer and a flat layer stacking-disposed on the interlayer dielectric layer;
an anode metal layer, a light emitting layer, and a cathode metal layer stacking-disposed on the flat layer;
wherein the flat layer is further provided with a pixel defining layer, the pixel defining layer is provided with a pixel opening, and the light emitting layer is located in the pixel opening; and wherein the active layer comprises an active island comprising a conductor layer and a semiconductor layer aligned with and in contact with the gate insulating layer, the conductor layer is provided with a protective layer, and the source/drain metal layer passes through the protective layer to contact and connect with the conductor layer, and
wherein the light shielding layer comprises a first metal electrode plate, the active layer further comprises a dielectric layer independent of the active island, the dielectric layer has a position aligned with the first metal electrode plate, and the second metal layer further comprises a second metal electrode plate disposed on the dielectric layer and independent of the source/drain metal layer.

2. The display panel according to claim 1, wherein the gate metal layer is provided with a protective layer covering the gate metal layer.

3. The display panel according to claim 1, wherein the dielectric layer is further provided with a protective layer covering the dielectric layer.

4. The display panel according to claim 1, wherein the interlayer dielectric layer is defined with an opening, wherein the second metal electrode plate is located in the opening.

5. The display panel according to claim 1, wherein the protective layer is an aluminum oxide protective layer.

6. A display panel, comprising:
a substrate;
a light shielding layer disposed on the substrate;
a buffer layer disposed on the substrate and covering the light shielding layer;
an active layer disposed on the buffer layer;
a gate insulating layer and a gate metal layer stacking-disposed on the active layer;
an interlayer dielectric layer disposed on the buffer layer and covering the gate metal layer;
a second metal layer disposed on the interlayer dielectric layer, wherein the second metal layer comprises a source/drain metal layer;
a passivation layer and a flat layer stacking-disposed on the interlayer dielectric layer;
an anode metal layer, a light emitting layer, and a cathode metal layer stacking-disposed on the flat layer;
wherein the active layer comprises an active island comprising a conductor layer and a semiconductor layer aligned with and in contact with the gate insulating layer, the conductor layer is provided with a protective layer, and the source/drain metal layer passes through the protective layer to contact and connect with the conductor layer; and wherein the light shielding layer comprises a first metal electrode plate, the active layer further comprises a dielectric layer independent of the active island, the dielectric layer has a position aligned with the first metal electrode plate, and the second metal layer further comprises a second metal electrode plate disposed on the dielectric layer and independent of the source/drain metal layer.

7. The display panel according to claim 6, wherein the gate metal layer is provided with a protective layer covering the gate metal layer.

8. The display panel according to claim 6, wherein the dielectric layer is further provided with a protective layer covering the dielectric layer.

9. The display panel according to claim 6, wherein the interlayer dielectric layer is defined with an opening, wherein the second metal electrode plate is located in the opening.

10. The display panel according to claim 6, wherein the protective layer is an aluminum oxide protective layer.

11. A method of fabricating a display panel, comprising:
   a step S10 of forming a light shielding layer on a substrate and a buffer layer covering the light shielding layer, wherein the light shielding layer comprises a first metal electrode plate;
   a step S20 of forming a patterned active layer on the buffer layer, wherein the active layer comprises an active island and a dielectric layer independent of the active island, and a position of the dielectric layer is aligned with a position of the first metal electrode plate;
   a step S30 of sequentially forming a gate insulating layer and a gate metal layer in stack on the active island;
   a step S40 of conductorizing a portion of the active island exposed by the gate insulating layer to form a conductor layer, and forming a protective layer covering the conductor layer;
   a step S50 of forming an interlayer dielectric layer covering the active layer and the gate metal layer;
   a step S60 of forming a second metal layer on the interlayer dielectric layer and the dielectric layer, and patterning the second metal layer to form a source/drain metal layer in contact with and in connection with the conductor layer and a second metal electrode plate independent of the source/drain metal layer, wherein the second metal electrode plate is disposed on the dielectric layer to form a storage capacitor with the first metal electrode plate;
   a step S70 of forming a passivation layer and a flat layer in stack on the interlayer dielectric layer; and
   a step S80 of sequentially forming an anode metal layer, a light emitting layer, and a cathode metal layer in stack on the flat layer.

12. The method of fabricating the display panel according to claim 11, wherein the step S40 comprises:
   a step S41 of forming a thin film from aluminum or/and aluminum oxide on the portion of the active island exposed by the gate insulating layer; and
   a step S42 of thermally annealing the thin film in an environment with oxygen, diffusing aluminum molecules into the portion of the active island exposed by the gate insulating layer, such that the portion of the active island exposed by the gate insulating layer forms the conductor layer, while oxygen atoms in the active island diffuse into the thin film to form the protective layer on the conductor layer, wherein the protective layer is an aluminum oxide protective layer.

13. The method of fabricating the display panel according to claim 12, wherein a protective layer is also formed on the gate metal layer and the dielectric layer while forming the protective layer on the conductor layer.

14. The method of fabricating the display panel according to claim 13, wherein the step S60 comprises:
   a step S61 of forming an opening in a position of the interlayer dielectric layer aligned with the first metal electrode plate to expose the dielectric layer;
   a step S62 of forming a second metal layer on the interlayer dielectric layer and the dielectric layer; and
   a step S63 of performing a patterning treatment on the second metal layer to form a source/drain metal layer in contact with and in connection with the conductor layer and a second metal electrode plate independent of the source/drain metal layer, wherein the second metal electrode plate is disposed on the dielectric layer to form the storage capacitor with the first metal electrode plate.

* * * * *